US006005464A

United States Patent [19]

Sakamaki et al.

[11] Patent Number: 6,005,464
[45] Date of Patent: Dec. 21, 1999

[54] ENGINE IGNITING COIL DEVICE

[75] Inventors: Makoto Sakamaki; Toshiyuki Shinozawa; Yoshiharu Saito, all of Tsurugashima, Japan

[73] Assignee: Toyo Denso Kabushiki Kasiha, Tokyo, Japan

[21] Appl. No.: 08/919,885

[22] Filed: Aug. 28, 1997

[30] Foreign Application Priority Data

| | | | |
|---|---|---|---|
| Aug. 31, 1996 | [JP] | Japan | 8-266500 |
| Aug. 31, 1996 | [JP] | Japan | 8-266502 |
| Aug. 31, 1996 | [JP] | Japan | 8-266505 |
| Aug. 31, 1996 | [JP] | Japan | 8-266509 |

[51] Int. Cl.[6] ...... H10F 27/00

[52] U.S. Cl. ...... 336/96; 336/92; 336/198; 336/107; 123/634

[58] Field of Search ...... 336/96, 198, 215, 336/92, 222, 205, 107, 190; 123/634, 635, 647

[56] References Cited

U.S. PATENT DOCUMENTS

| | | | |
|---|---|---|---|
| 4,514,712 | 4/1985 | McDougal | 336/96 |
| 5,537,983 | 7/1996 | Nakajima | 123/635 |
| 5,632,259 | 5/1997 | Konda et al. | 336/105 |
| 5,758,624 | 2/1997 | Satou et al. | 123/634 |
| 5,771,870 | 12/1996 | Satou et al. | 123/635 |
| 5,778,863 | 12/1995 | Oosuka et al. | 336/96 |

FOREIGN PATENT DOCUMENTS

| | | | |
|---|---|---|---|
| 4-143461 | 5/1992 | Japan . | |
| 4-23296 | 5/1992 | Japan . | |
| 2 199 193 | 6/1988 | United Kingdom | 336/96 |

*Primary Examiner*—Michael L. Gellner
*Assistant Examiner*—Anh Mai
*Attorney, Agent, or Firm*—Lyon & Lyon LLP

[57] ABSTRACT

An engine igniting coil device adapted to be mounted in a cylindrical bore of an engine and directly connected with an ignition plug therein has a coil case containing an igniting coil assembly and made of conductive magnetic material which is held at the ground potential level, thus preventing a decrease of output factor of the igniting coil of produced magnetic flux when spreading about and passing through a cylinder head of the engine and eliminating the possibility of leakage discharge from a high-voltage portion of the igniting coil assembly to the coil case and the cylinder head.

4 Claims, 6 Drawing Sheets

ENGINE IGNITING COIL DEVICE

BACKGROUND OF THE INVENTION

The present invention relates to an open-magnetic-circuit-type engine igniting coil device.

Japanese Utility Model Publication No. 4-23296 discloses an open-magnetic-circuit-type engine igniting coil device which has a coil case, in which an ignition coil assembly consisting of a primary coil bobbin with a rod-shaped core inserted in its hollow center and a secondary coil bobbin coaxially surrounding the primary coil bobbin is mounted and integrally potted with melted insulating resin, and has an ignition-plug connector integrally formed on the coil case to allow a tip of an ignition plug to contact with a high-voltage terminal inwardly projecting in the connector portion.

Usually, melted insulating resin is injected into a slender cylindrical coil case in pre-evacuated state. In this case, it is needed to fill the coil case with an excessive amount of the liquid resin because poured resin is further drawn into the coil case when the latter is exposed to an atmosphere pressure.

In the conventional engine igniting coil device, an output terminal 71 of a secondary coil shown in FIG. 9 is connected by fusion to a high-voltage terminal 12' having a U-shaped cross-section, which is attached to a secondary coil bobbin 8'.

In another conventional arrangement shown in FIG. 10, an output terminal 71 of a secondary coil is wound on and soldered to a projecting high-voltage terminal 12' attached to a secondary coil bobbin 8'.

Japanese Laid-Open Patent No. 4-143461 discloses another engine igniting coil device comprising a cylindrical coil case having a high-voltage terminal connector in its open-bottom end and incorporating a coil assembly consisting of primary and secondary coil-wound bobbins with a core inserted in a hollow center of the coil bobbin and integrally potted therein with melted insulating resin, which is mounted in a bore in a cylinder head of an engine and is connected at its connector with an ignition plug of the engine.

The above-mentioned prior art devices, however, involve the following problems to be solved:

The first problem is that the conventional open-magnetic-circuit type engine igniting coil device having the rod-like core inserted in a hollow center of the coil assembly consisting of primary coil-wound and secondary coil-wound bobbins may allow a magnetic flux produced therein to spread outwardly and lose part of the magnetic flux when passing through the cylinder block of the engine, resulting in decreasing the output factor of the secondary coil. Consequently, the device must be larger to obtain a desired secondary output voltage.

An attempt to prevent spreading of the magnetic flux produced in the device by covering the coil case with magnetic plates was accompanied by a leakage-current discharge from the high-voltage portion to the magnetic plates.

The second problem is that an amount of melted insulating resin injected into an engine igniting coil device may be variable and an excess of melted resin may be spilled out and contaminate the outer surface of the coil case while the latter is transported to a curing furnace. To avoid this, it is necessary to increase the volume of the coil case.

In the coil case, residual air may form bubbles of melted resin, which may spray out and contaminate the outer surface of the coil case.

The cylindrical coil case having a narrow opening and long body can not be entirely filled with melted resin if air is left and shut in the coil case. Therefore, melted resin is poured gradually little by little into the coil case, which takes much time.

The third problem is that a conventional engine igniting coil device which is mounted in a bore in a cylinder head of an engine and attached directly to an ignition plug of the engine may be subjected to vibration of the engine and, therefore, requires the provision of means for decreasing the vibration transmitted therefrom.

The engine igniting coil device mounted in a bore in a cylinder head of an engine may also be subjected to a large thermal stress in an axial direction of its coil case and requires the provision of means for absorbing an axial thermal elongation and contraction of metal.

The fourth problem is that an engine igniting coil device has a large terminal connection. Typically, an output terminal of a secondary coil is connected by fusion to a U-shape type high-voltage terminal or by soldering to a projecting type high-voltage terminal attached to a secondary coil bobbin. Both terminal connecting means must be located outside of the secondary coil bobbin and separated from the coil case to provide a necessary insulation distance. This may increase the size of the engine igniting coil device.

SUMMARY OF THE INVENTION

Accordingly, an object of the present invention is to provide an open-magnetic-circuit type engine igniting coil device to be mounted in a cylindrical bore in a cylinder head of an engine and attached directly to a ignition plug of the engine, which comprises a coil case containing an assembly consisting of a secondary coil bobbin and a primary coil bobbin with a rod-like core and integrally potted therein with melted resin insulation, wherein the coil case itself is made of electroconductive magnetic material to prevent the magnetic flux produced therein from spreading outward and, in addition, the coil case is held at the ground potential level to prevent the occurrence of leakage current from a high-voltage portion to the coil case.

Another object of the present invention is to provide an open-magnetic-circuit type engine igniting coil device comprising a coil case incorporating an igniting coil assembly, wherein a low-voltage terminal socket fitted on an upper cylindrical open end of the coil case has internal partitions for limiting a level of melted insulating resin poured into the low-voltage socket through its upper open-end by overflowing an excess of melted resin into cup-like spaces formed therein by the partitions to thus absorb excessive amount of poured melted resin without spilling out of the coil case.

Another object of the present invention is to provide an open-magnetic-circuit type engine igniting coil device comprising a coil case containing an igniting coil assembly, wherein a low-voltage terminal socket fitted on an upper cylindrical open-end of the coil case is covered at its open end with a cap having a hole made therein for inserting a nozzle for injecting melted insulating resin into the low-voltage terminal socket without spraying melted resin out of the coil case.

Another object of the present invention is to provide an open-magnetic-circuit type engine igniting coil device comprising a coil case containing an igniting coil assembly, wherein a pipe communicating an inside of the coil case with the inside of the low-voltage terminal socket is provided for the escape of gas from the inside of the coil case while melted insulating resin is poured into the coil case through the upper open-end portion of the low-voltage terminal socket.

Another object of the present invention is to provide an open-magnetic-circuit type engine igniting coil device to be mounted in a cylindrical bore in a cylinder head of an engine and attached to a ignition plug therein, wherein a coil case is provided at its upper end with a damping member made of elastic material, which is interposed between the coil case and the cylinder head and is provided with a collar interposed for restricting tightening force of the bolt for securing the coil case to the cylinder head in order to effectively absorb vibration transmitted from the engine side.

Another object of the present invention is to provide an open-magnetic-circuit type engine igniting coil device to be mounted in a cylindrical bore in a cylinder head of an engine and attached directly to an ignition plug, wherein a plug cover is provided with a lower damping member made of elastic material for holding an ignition plug in order to effectively absorb vibration transmitted from the engine side.

Another object of the present invention is to provide an open-magnetic-circuit type engine igniting coil device to be mounted in a cylindrical bore in a cylinder head of an engine and attached directly to an ignition plug, wherein a coil case is provided at its inside with an elastic member whose upper end outwardly bent over the upper end of the coil case for fitting a bolt holding flange thereon in order to effectively absorb axial thermal elongation of the coil case.

Another object of the present invention is to provide an open-magnetic-circuit type engine igniting coil device to be mounted in a cylindrical bore in a cylinder head of an engine and attached directly to a ignition plug, wherein a secondary coil bobbin has a protrusion formed at a center portion of its lower end for fitting thereon a cylindrical high-voltage terminal having a protruding clamp formed at the edge thereof to be bent for securing a secondary-coil output terminal to the high-voltage terminal in order to make the terminal connection very compact.

DESCRIPTION OF THE PREFERRED EMBODIMENTS

The preferred embodiments of the present invention will now be described in detail by way of example and with reference to the accompanying drawings.

Figure 1:
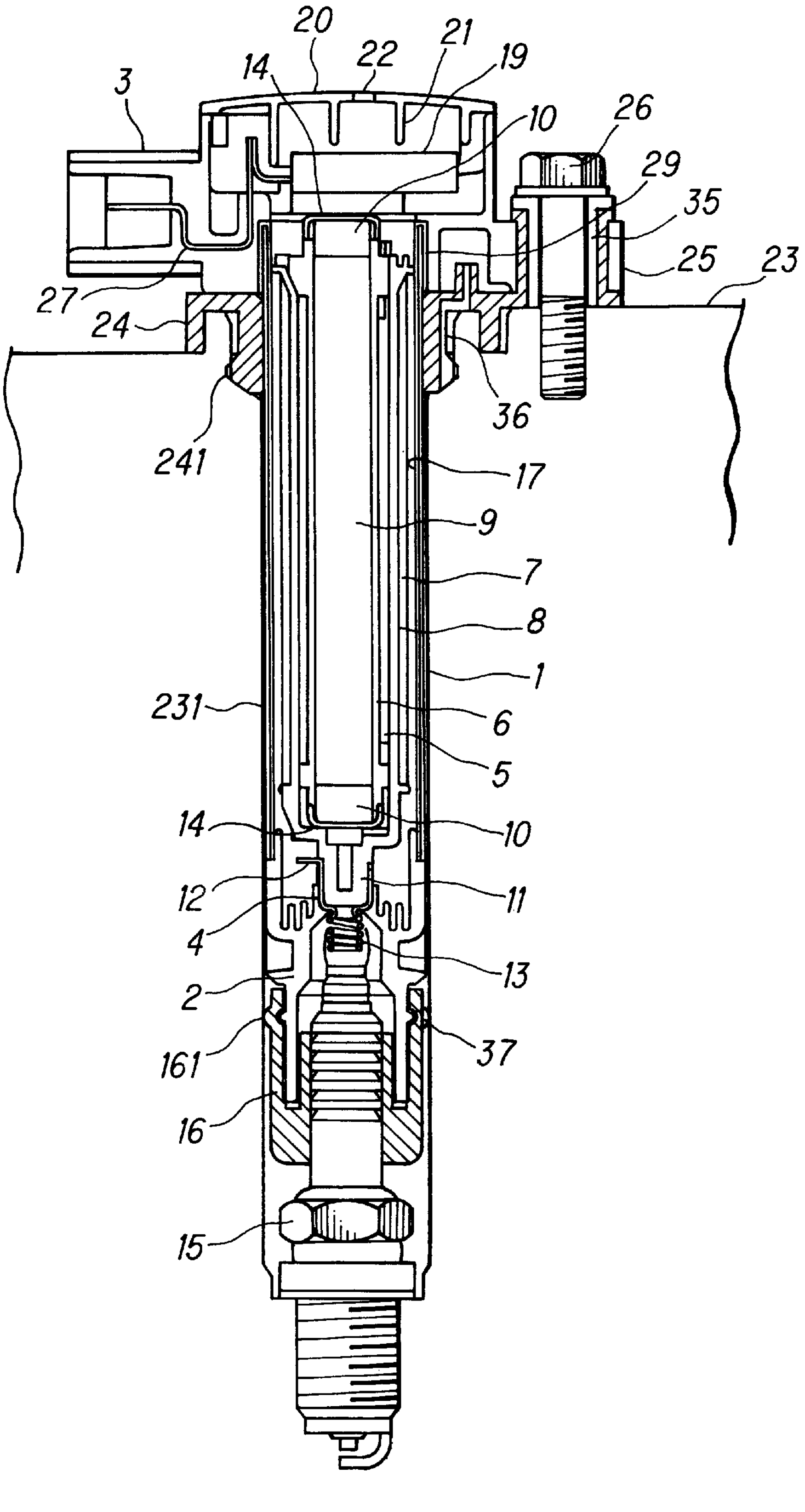
FIG. 1 is a sectional front view of an engine igniting coil device embodying the present invention.

FIG. 1 shows an open-magnetic-circuit-type engine igniting coil device which is designed to be directly attached to an ignition plug of the engine.

The engine igniting coil device comprises a coil case 1, an ignition coil assembly mounted in the case 1, a plug cover 2 fitted in an open bottom-end of the case 1 and a low-voltage-terminal socket 3 containing an igniter therein and being externally fitted on an upper open end of the case 1.

The coil case 1 accommodates the ignition coil assembly of a primary coil bobbin 6 with a primary coil 5 having a hollow center with a rod-like core 9 inserted therein and a secondary coil bobbin 8 with a secondary coil 7 coaxially mounted on the primary coil 5 and bobbin 6. The core 9 is provided at each end with a permanent magnet 10 for obtaining a large change in magnetic flux with an interrupted primary current.

Figure 2:
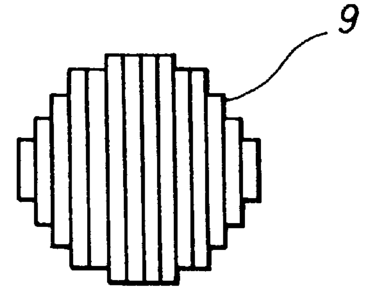
FIG. 2 is a plan view of a core of the engine igniting coil device shown in FIG. 1.

As shown in FIG. 2, the core 9 is composed of laminations of iron plates having different widths with a nearly circular cross-section having an increased space factor in the hollow center of the cylindrical coil bobbin 6 to effectively produce a magnetic flux therein.

A high-voltage terminal holder 11 is a center projection formed integrally with the end portion of the secondary coil bobbin 8. A high-voltage terminal 12 bonded to the holder 11 has a spring contact 13 attached thereto for providing electrical connection with an ignition plug 15.

The coil assembly is mounted in a given position in the coil case and fixed therein in such a manner that a holder portion 11 for the high-voltage terminal 12 is press-fitted in the small tubular hole 4 provided in a center portion of the plug case 2 and the spring contact 13 is outwardly projected from the small tubular hole 4.

The coil case 1 with the assembly fixed at the given place therein is filled with melted insulating resin (e.g., epoxy resin) injected through its upper open-end to form a single solid device with solidified resin insulation therein.

The permanent magnets 10 attached one to each end of the core 9 are covered with damping members 14, respectively, which can prevent intrusion of melted resin into the core 9 and absorb relatively large thermal stress produced in the longitudinal direction of the core 9, thus preventing cracking of the insulating resin layer formed around the core 9.

The plug cover 2 is provided at its end with a plug rubber 16. The ignition plug 15 is inserted into the plug rubber 16 wherein its tip contacts the spring contact 13 for creating the electrical connection of the ignition coil device with the ignition plug 15 of the engine.

The low-voltage-terminal socket 3 contains an igniter 19.

The socket 3 is fitted on an outwardly bent portion 29 of the elastic member 17 provided on the inside wall of the case 1 to assure a high sealing quality.

Figure 3:
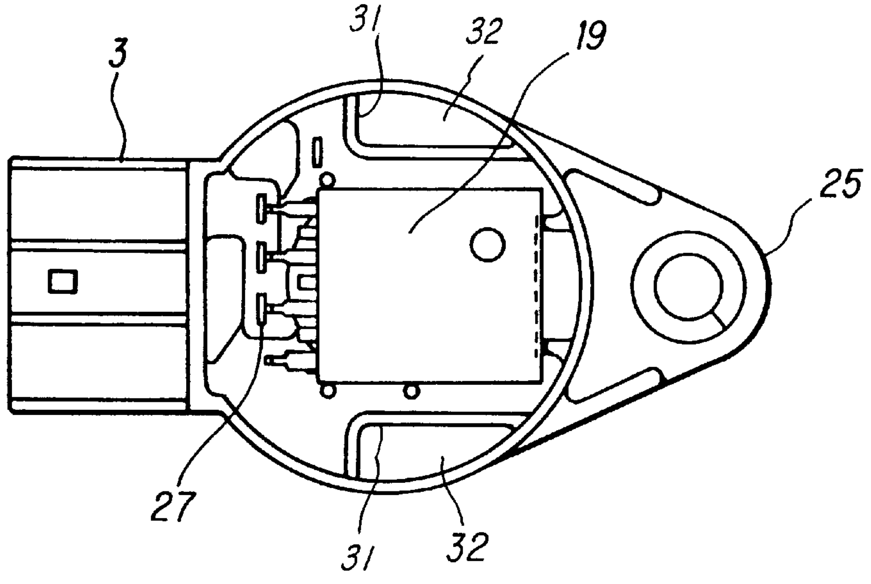
FIG. 3 is a plan view of a low-voltage terminal socket (with a cap removed) of the engine igniting coil device shown in FIG. 1.

FIG. 3 shows an internal structure of the low-voltage-terminal socket 3 with a cap 20 removed.

Melted resin is poured by using an injection nozzle into the low-voltage terminal socket 3 through a port 22 provided in the cap 20 mounted thereon until the tips of ribs 21 formed on the inside wall of the cap 20 are immersed in liquid resin. Thus, the cap 20 is integrally secured to the low-voltage-terminal socket. The ribs 21 of the cap 20 serve as a cushion for dispersing thermal stress to the resin layer, thus preventing cracking of the resin layer above the igniter 19.

The coil case 1 has a sealing rubber 24 fitted on its external wall under the low-voltage terminal socket 3. This sealing rubber 24 tightly seals the open end of the cylindrical bore 231 in the cylinder head 23 of the vehicle engine when the coil case 1 is inserted into the cylindrical bore 231 of the cylinder head 23.

With the coil case 1 positioned in the cylindrical bore 231, a flange 25 integrally formed with the low-voltage terminal socket 3 is secured with a bolt 26 to the cylinder head 23.

According to the present invention, the coil case 1 is made of conductive magnetic material having a high permeability (e.g., silicon steel) and is grounded.

In practice, the coil case 1 is held at the ground potential level through an electrical connection between the coil case 1 and a grounding terminal 27 in the low-voltage terminal socket 3.

The coil case can also be held at the ground potential level through a seal cover 24 made of electro-conductive rubber, which is fitted on the coil case 1 and is in contact with the cylinder head of the engine. In this case, the coil case 1 can be reliably grounded with no electrical wiring.

Thus, the coil case 1 has an electromagnetic shielding effect and acts as a side core for concentrating a larger portion of magnetic flux produced by the open-magnetic-circuit type ignition coil assembly to the case 1, thus preventing loss of the produced magnetic flux by passing through a cylinder block of the engine to cause a drop of a secondary output voltage.

Because the coil case 1 is maintained at the ground potential level, one is protected against an electrical shock by a discharge of leakage current from any internal high potential portion of the case 1. Furthermore, the occurrence of a local corona discharge between the secondary coil 7 and the coil case 1 can be effectively prevented. This improves the durability of the insulating resin layer formed therebetween.

The tight connection of the coil case 1 with the cylinder head of the vehicle engine eliminates the possibility of electric discharge therebetween, thus improving the performance of the control system of the engine and peripheral devices.

Figure 4:
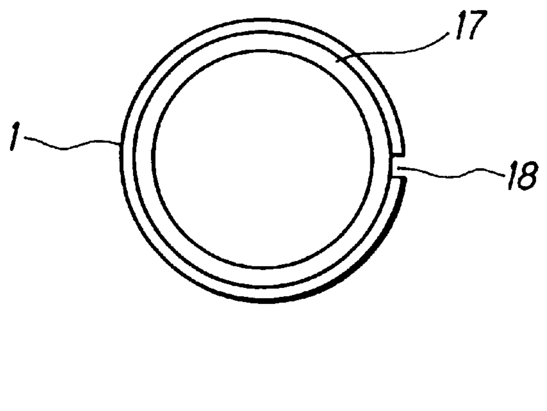
FIG. 4 is an end view of a coil case of the engine igniting coil device shown in FIG. 1.

As shown in FIG. 4, the coil case 1 has a slit 18 to form a gap of 0.5 to 1.5 mm in longitudinal direction and a C-shaped section to minimize an eddy current loss.

The coil case 1 is internally covered with an elastic member 17 such as rubber and elastomer. This elastic member 17 separates the resin layer from the inner wall of the coil case 1 and absorbs any thermal stress of the metal, thus preventing the resin layer from cracking.

In the engine igniting coil device according to the present invention, a low-voltage terminal socket 3 has cup-like spaces (small compartments) 32 (FIGS. 3 and 5) formed therein by inner partitions 31 of a specified height for limiting a level of melted insulation resin poured into the low-voltage socket through its upper open-end by allowing an excess of melted resin to overflow into the cup-like spaces 32.

The socket 3 is thus correctly filled with liquid resin to the specified level limited by the height of the partitions 31 by transferring any excess of liquid resin into the spaces 32.

Figure 5:
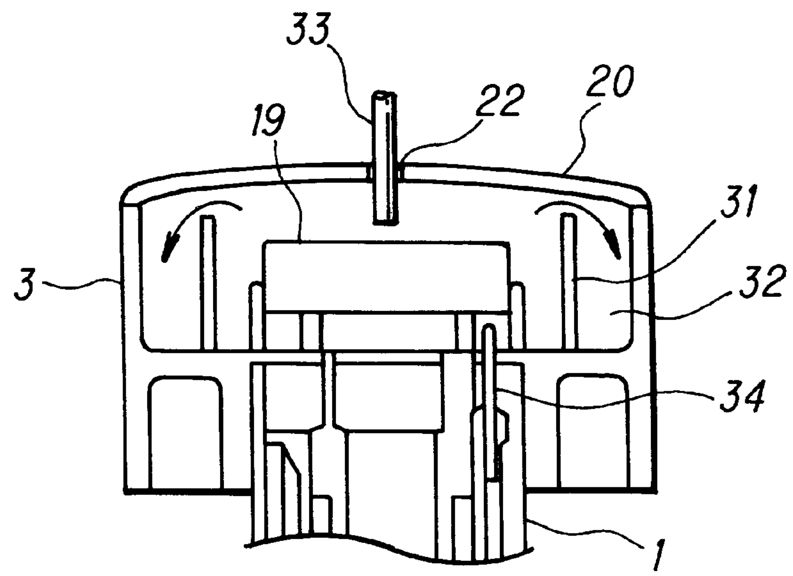
FIG. 5 is a sectional side view of the low-voltage terminal socket of the engine igniting coil device shown in FIG. 1.

According to the present invention, the low-voltage terminal socket 3 is covered with a cap 20 having a hole 22 provided therein for insertion of an injection nozzle 33 for pouring melted insulating resin into the low-voltage terminal socket 3 as shown in FIG. 5.

Injecting liquid resin into the socket 3 by using the nozzle 33 inserted in the hole 22 of the cap 20 fitted on the socket can surely protect against splashing of liquid resin that may bubble and scatter out of the socket if the cap is removed.

In this case, melted resin is poured by using an injection nozzle into the low-voltage terminal socket 3 through a port 22 in the cap 20 mounted thereon until tips of ribs 21 formed on the inside wall of the cap 20 are immersed in liquid resin. Thus, the cap 20 is integrally fixed on the low-voltage-terminal socket. The ribs 21 of the cap 20 serve as a cushion for dispersing thermal stress to the resin layer, thus preventing cracking of the resin layer on the igniter 19.

According to the present invention, the coil bobbin 8 is provided with a pipe 34 for communicating the inside of the coil case 1 with the inside of the low-voltage terminal socket 3 as shown in FIG. 5. This pipe 34 is used for the escape of gas from the coil case 1 while melted insulating resin is poured into the low-voltage terminal socket 3 through an upper open-end thereof.

The coil case 1 can be entirely filled with melted insulating resin since the pipe 34 allows gas to freely escape from the coil case 1.

In the engine igniting coil device of the present invention, an upper damping member 24 is fitted on the upper end of the coil case 1 in such manner that it is interposed between the cylinder head 23 and the lower-voltage terminal socket 3 with an integrally formed flange portion 25 to be secured by a bolt 26 to the cylinder head 23. This upper damping member 24 can absorb the vibration of the engine.

The upper damping member 24 extends to cover the inside of a bolt hole made in the flange portion 25 of the low-voltage terminal socket 3 and holding the bolt 26 through a collar 35 interposed therebetween for restricting the tightening force of the bolt 26.

Figure 6:
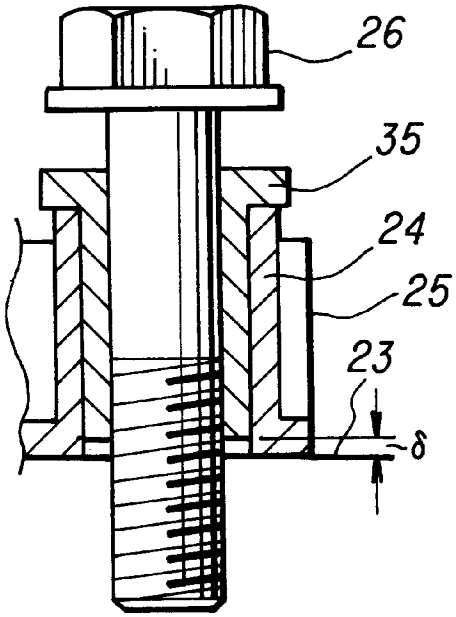
FIG. 6 is a sectional front view of a bolted connection portion of the engine igniting coil device shown in FIG. 1.

As shown in FIG. 6, the collar 35 engages at its upper portion with the damping member 24 and has a specified gap $\delta$ between its end face and the cylinder head when the bolt 26 is not tightened.

When the bolt is firmly tightened, the collar 35 compresses the upper damping member 24 by the length $\delta$ but prevents further compression of the damping member 24, thus assuring that it may effectively absorb the vibration of the engine.

This extended portion of the upper damping member 24 may be separate, especially for use in the hole of the flange portion 25 of the low-voltage terminal socket.

The upper damping member 24 fitted on the upper portion of the coil case 1 mounted in the cylindrical bore 231 can also serve as a sealing member for tightly sealing the cylindrical bore 231 against water and other foreign matters.

The cylindrical-bore sealing portion of the upper damping member 24 has an air vent 36 therein for the escape of air from the inside of the cylindrical bore 231, thus preventing an increase in pressure of air warmed in the cylindrical bore 231.

The upper damping member 24 also serves as a centering member for aligning the coil case 1 when mounting the latter in the cylindrical bore 231. The cylindrical-bore sealing portion of the upper damping member 24 has an outwardly protruding rib 241 formed thereon for aligning the coil case 1 by abutting against the inner wall of the cylindrical bore 231.

According to the present invention, a plug cover 2 (FIG. 1) is provided with a lower damping member 16 made of elastic material such as rubber, which serves as a plug rubber 16 for holding an ignition plug 15 and absorbing vibration transmitted from the engine.

The plug rubber (lower damping member) 16 can effectively absorb a vibration transmitted from the engine through the ignition plug, maintaining a reliable electrical connection between a spring contact 13 and the ignition plug 15.

The plug rubber (lower damping member) 16 has an outwardly protruding rib 161 thereon for aligning the coil case 1 by abutting against the inner wall of the cylindrical bore 231.

The rib 161 has a notch 37 made in a part thereof for the escape of air from the inside of the cylindrical bore 231.

The plug rubber (lower damping member) 16 also serves as a protection member for preventing flashover of the ignition plug 15.

According to the present invention, the coil case 1 is provided at an inner wall with an elastic member 17 whose upper end 29 is outwardly bent and folded over to sandwich or cover the upper end of the coil case 1. The low-voltage terminal socket 3 having the integrally formed flange portion 25 is fitted on the bent-portion 29 of the elastic member 17 on the coil case 1.

With the ignition coil device secured at its flanged portion 25 with a bolt 26 to the cylinder head 23, the bent portion 29 of the elastic member 17 works as a damping member for absorbing a thermal stress produced in the coil case. Namely, the ignition coil device mounted in the bore 231 and directly attached to the ignition plug of the engine may be subjected to thermal elongation and contraction resulting from a large thermal stress produced therein in an axial direction. This thermal deformation can be effectively absorbed by the bent portion 29 of the elastic member 17.

Figure 7:
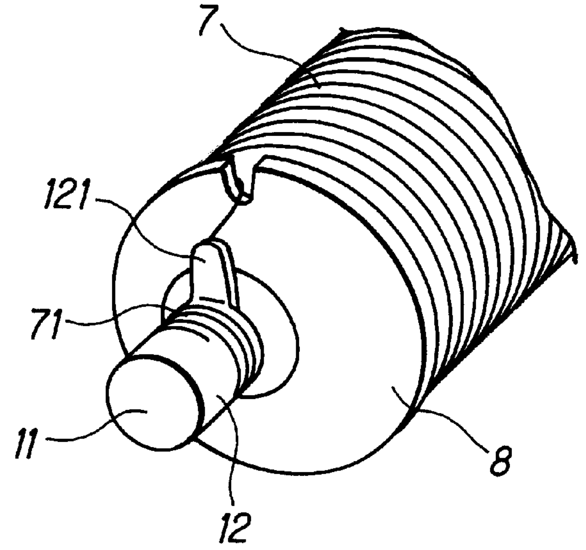
FIG. 7 is a perspective view showing a secondary coil bobbin with a secondary-coil output terminal wound on a high-voltage terminal.
Figure 8:
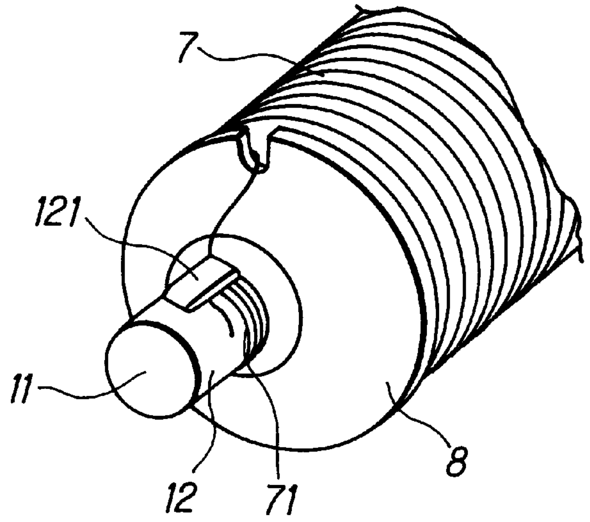
FIG. 8 is a perspective view showing a secondary coil bobbin with a secondary-coil output terminal fixed on a high-voltage terminal with a bent clamp.
Figure 9:
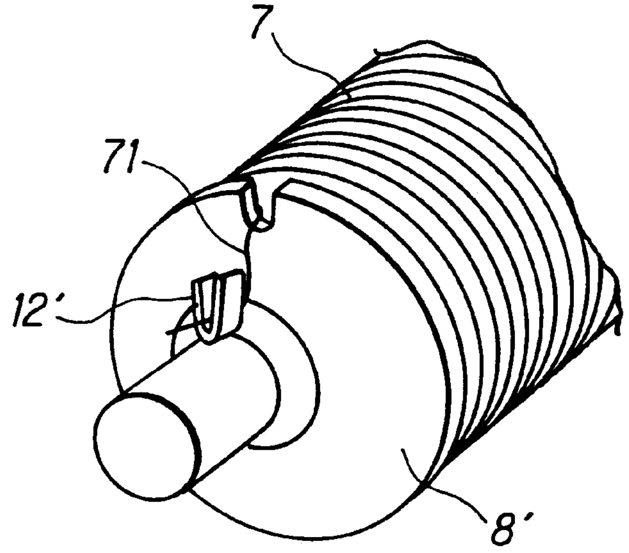
FIG. 9 PRIOR ART
FIG. 9 is a perspective view showing an example of connecting means for connecting a secondary-coil output terminal with a high-voltage terminal on a conventional secondary coil bobbin.
Figure 10:
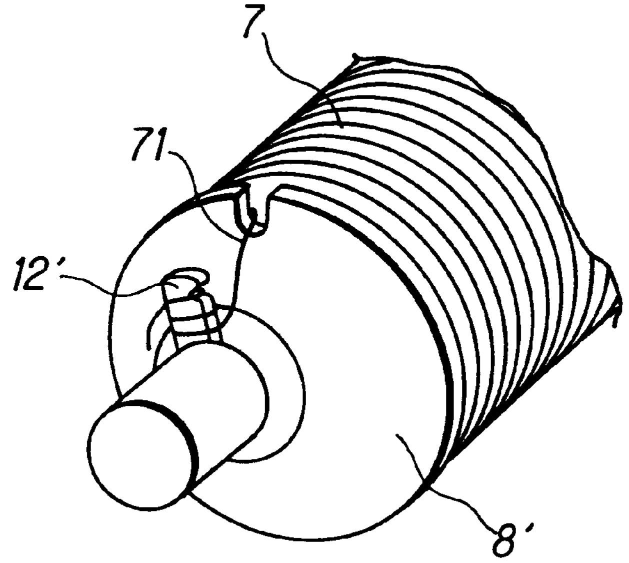
FIG. 10 PRIOR ART
FIG. 10 is a perspective view showing another example of connecting means for connecting a secondary-coil output terminal with a high-voltage terminal on a conventional secondary coil bobbin.

In the engine igniting coil device according to the present invention, as shown in FIGS. 7 and 8, the electrical connection between an output terminal (wire) 71 of the secondary coil 7 and the high-voltage terminal 12 is made in such a manner that the tubular high-voltage terminal 12 with a terminal clamp 121 formed at an edge thereof is fitted on a high-voltage-terminal holding portion 11 formed at a center portion of the lower end of a secondary coil bobbin 8, then the output terminal 71 of the secondary coil 7 is wound several turns around the tubular portion of the high-voltage terminal 12, fixed thereat by bending the terminal clamp 121, and finally connected thereto by fusing.

The above-mentioned connection between the secondary-coil output terminal 71 and the high-voltage terminal 12 requires only a small space with no projecting portion, assuring a necessary insulation distance from the coil case 1 (i.e., there is no need for separating the connection part further apart from the coil case). This may be effective to reduce the size of the engine igniting coil device.

Figure 11:
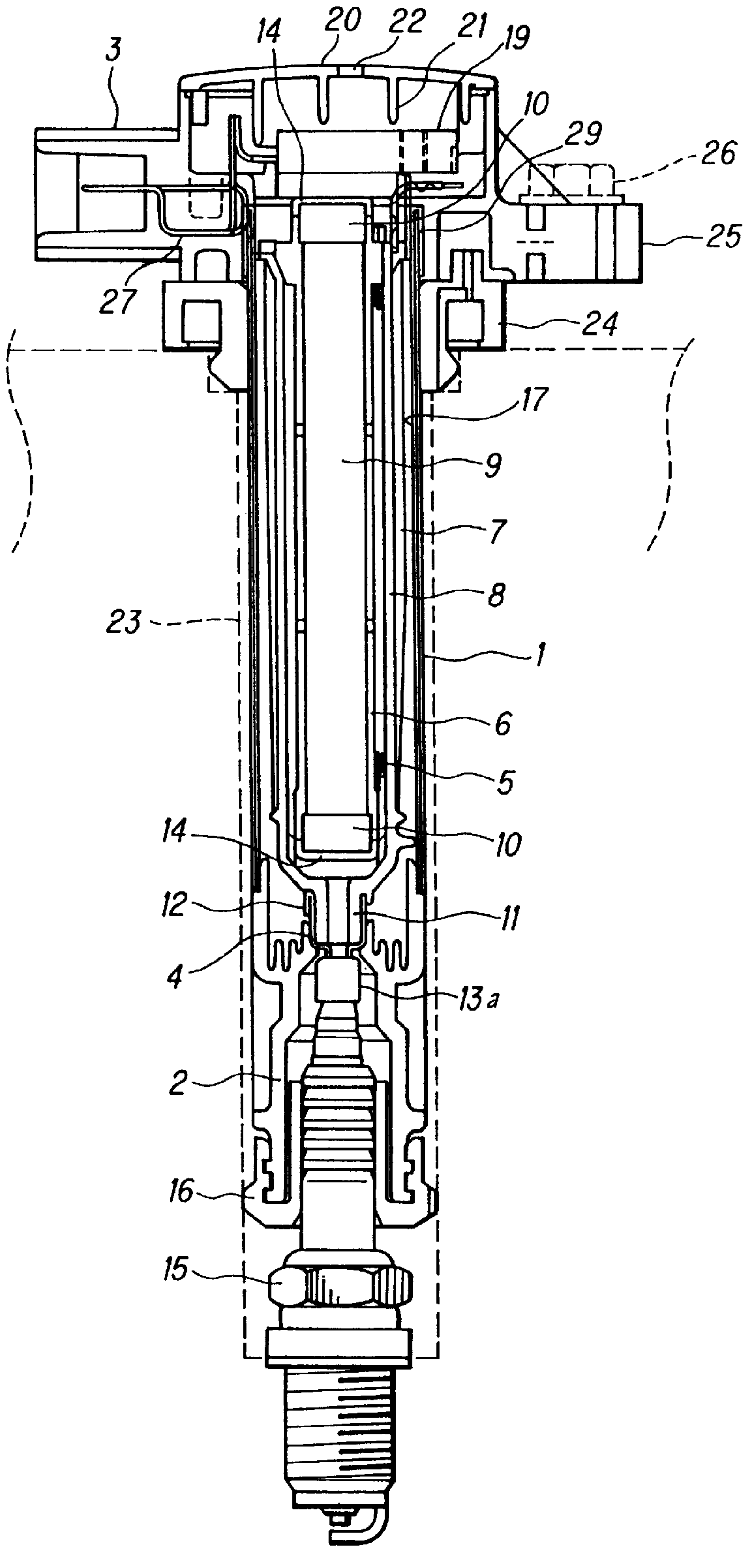
FIG. 11 is a sectional front view showing another construction of an engine igniting coil device according to the present invention.

According to the present invention, a contact 13*a* made of electroconductive rubber (FIG. 11) may be used instead of spring 13 for providing the electrical connection between the high-voltage terminal 12 and the ignition plug 15.

In comparison with a conventional spring or leaf-spring type contact (for point or line contact), the contact 13*a* made of flexible electroconductive rubber has an increased surface contacting with the ignition plug 15 and can therefore prevent the occurrence of micro-discharges which may arise due to partial contact and may affect peripheral electric devices. The contact 13*a* can withstand vibrations and does not cause the flashover of the ignition plug 15 which may arise with friction powder and/or poor or broken contact. The use of the elastic contact 13*a* can always maintain an excellent electrical connection of the high-voltage terminal 12 with the ignition plug 15.

As described above, the present invention provides an engine igniting coil device that has the following advantages:

In an open-magnetic-circuit type engine igniting coil device mountable into a cylindrical bore in a cylinder head of an engine and directly attachable to an ignition plug, a coil case for accommodating the inner coil assembly is made of magnetic material having electric conductivity and held at a ground potential level, thus effectively preventing decreasing the output factor of the device due to an iron loss of a part of the produced magnetic flux when spreading and passing through a cylinder block of the engine and preventing current from leaking from an internal high-voltage portion to the coil case and the cylinder block.

In an engine igniting coil device according to one aspect of the present invention, a low-voltage terminal socket fitted on an upper end of a coil case has internal partitions for limiting the level of melted insulating resin poured into the low-voltage socket through its upper open-end by overflowing an excess of melted resin into cup-like spaces formed therein by the partitions. Namely, the low-voltage terminal socket can absorb an excess of melted insulating resin by itself with no need for enlarging the volume of the coil case and without contaminating the external surface of the product (low-voltage terminal socket and the coil case) with spills of the melted resin.

In an engine igniting coil device according to another aspect of the present invention, a low-voltage terminal socket fitted on an upper end of a coil case is covered at its open end with a cap having a hole therein for inserting a nozzle for injecting melted insulating resin into the low-voltage terminal socket, thus eliminating the possibility of splashing bubbled melted resin out of the low-voltage terminal socket. This can prevent the product from being contaminated with resin.

In an engine igniting coil device according to another aspect of the present invention, a pipe communicating the inside of a coil case with the inside of a low-voltage terminal socket is provided for the escape of gas from the inside of the coil case while melted insulating resin is poured therein through the upper open-end portion of the low-voltage terminal socket. This pipe allows gas to freely escape from the coil case. The coil case can, therefore, be entirely filled with melted insulating resin.

In the engine igniting coil device directly attachable to an ignition plug of the engine according to another aspect of the present invention, an upper end of a coil case is provided with an upper damping member made of elastic material that is interposed between a cylinder head and the coil case and is fitted with a collar for restricting the tightening force of the bolt for securing the ignition coil device to the cylinder head, whereby the upper damping member can absorb vibration of the engine for keeping the ignition coil device in an optimal working condition.

In the engine igniting coil device directly attachable to an ignition plug of the engine according to the present invention, a plug cover is provided with a lower damping member made of elastic material which can absorb vibration transmitted from the engine, allowing the ignition coil device to work in an optimal working condition by keeping a reliable contact with an ignition plug of the engine.

In the engine igniting coil device directly attachable to an ignition plug of the engine according to another aspect of the present invention, the coil case is provided at an inner wall with an elastic member whose upper end is outwardly bent over the upper end of the coil case and a low-voltage terminal socket having the integrally formed flange portion is fitted on the bent-portion of the elastic member on the coil case. With the ignition coil device secured at its flanged portion with a bolt to the cylinder head, the bent portion of the elastic member can effectively absorb the thermal elongation and contraction of the device due to a large thermal stress produced therein in an axial direction.

In the engine igniting coil device according to another aspect of the resent invention, the electrical connection between an output terminal of a secondary coil and a high-voltage terminal is made in such a manner that the tubular high-voltage terminal with a terminal clamp formed at an edge thereof is fitted on a high-voltage-terminal holding portion formed at a center portion of the lower end of a secondary coil bobbin, then the output terminal of the secondary coil is wound several turns around the tubular portion of the high-voltage terminal, fixed thereon by bending the terminal clamp, and finally connected thereto by fusing. The connection between the secondary-coil output terminal and the high-voltage terminal requires only a small space with no projecting portion, thereby assuring a necessary insulation distance from the coil case. This is effective to create a compact engine igniting coil device.

According to another aspect of the present invention, a contact made of conductive rubber is used for providing the electrical connection between the high-voltage terminal and the ignition plug. The contact has an increased surface contacting with the ignition plug and can therefore prevent the occurrence of micro-discharges which may arise due to partial contact and affect peripheral electric devices. The contact can withstand vibrations and does not cause the flashover of the ignition plug, which may arise with friction powder and a poor or broken contact. The use of the elastic contact can always maintain an excellent electrical connection of the high-voltage terminal with the ignition plug.

We claim:

1. An open-magnetic-circuit type engine igniting coil device mountable into a cylindrical bore in a cylinder head of an engine and directly attachable to an ignition plug, which device comprises a coil case containing an inner coil assembly composed of primary and secondary coil-wound bobbins having a rod-like core inserted in a hollow center of said bobbins and potted in the coil case with insulating resin for forming a single solid coil device and which is characterized in that the coil case for accommodating therein the inner coil assembly is made of magnetic material having electric conductivity and can be held at a ground potential level.

2. An engine igniting coil device as defined in claim 1, characterized in that the coil case can be held at a ground potential level by electrically connecting the coil case with a ground terminal to which an end of a primary coil is connected.

3. An engine igniting coil device as defined in claim 1, characterized in that the coil case has an electrically conductive rubber member fitted thereon for connection with an engine cylinder-head portion and can be held at a ground potential level through said connection with the cylinder head.

4. An engine igniting coil device as defined in claim 3, characterized in that the electrically conductive rubber member fitted on the coil case serves as a sealing rubber for sealing the cylindrical bore made in the engine cylinder head.

* * * * *